United States Patent [19]

Seio et al.

[11] Patent Number: 4,999,274

[45] Date of Patent: Mar. 12, 1991

[54] POSITIVE TYPE PHOTOSENSITIVE RESINOUS COMPOSITION WITH 1,2 QUINONE DIAZIDE SULFONYL UNIT

[75] Inventors: Mamoru Seio, Hyogo; Kanji Nishijima, Osaka; Katsukiyo Ishikawa, Kyoto, all of Japan

[73] Assignee: Nippon Paint Co., Ltd., Osaka, Japan

[21] Appl. No.: 255,193

[22] PCT Filed: Feb. 2, 1988

[86] PCT No.: PCT/JP88/00094

§ 371 Date: Oct. 27, 1988

§ 102(e) Date: Oct. 27, 1988

[87] PCT Pub. No.: WO88/05928

PCT Pub. Date: Aug. 11, 1988

[30] Foreign Application Priority Data

Feb. 2, 1987 [JP] Japan ............... 62-23115

[51] Int. Cl.$^5$ .................. G03G 1/60; G03F 7/023
[52] U.S. Cl. .................. 430/190; 430/192; 430/302; 430/326
[58] Field of Search .......... 430/190, 192, 193

[56] References Cited

U.S. PATENT DOCUMENTS

| | | | |
|---|---|---|---|
| 3,890,153 | 6/1975 | Dijkstra et al. | 430/192 |
| 4,028,111 | 6/1977 | Iwasaki et al. | 430/190 |
| 4,529,682 | 7/1985 | Toukhy | 430/190 |
| 4,857,437 | 8/1989 | Banks et al. | 430/190 |

FOREIGN PATENT DOCUMENTS

| | | | |
|---|---|---|---|
| 2545697 | 4/1977 | Fed. Rep. of Germany | 430/190 |
| 63-116148 | 5/1988 | Japan | 430/190 |

*Primary Examiner*—Charles L. Bowers, Jr.
*Attorney, Agent, or Firm*—Wenderoth, Lind & Ponack

[57] ABSTRACT

The invention provides a positive type photosensitive resinous composition comprising a resin obtained by the reaction of a polyepoxide compound, an aromatic or heterocyclic carboxylic acid bearing a phenolic hydroxyl group(s) and 1,2-quinondiazido sulfonic acid halide with the use of those three components in a defined proportion, which is useful for microfabrication photo-resist and photosensitive materials for use in lithographic plates because of excellent flexibility and adhesion to supporting substrates, when developed, non-exposed area are extremely resistive toward swelling.

2 Claims, No Drawings

POSITIVE TYPE PHOTOSENSITIVE RESINOUS COMPOSITION WITH 1,2 QUINONE DIAZIDE SULFONYL UNIT

FIELD OF INVENTION

The present invention relates to a positive type photosensitive resinous composition which is useful in the preparation of microfabrication photoresists for printed wiring boards and integrated circuit boards and photosensitive materials for lithographic plates and the like.

BACKGROUND OF THE INVENTION

Heretofore, positive type photosensitive compositions have been widely used in various technical fields as, for example, preparation of semiconductor equipments, printed wiring boards, printing plates and the like. As the photosensitive composition capable of forming a positive image, i.e. positive type photosensitive composition, use has generally been made of such composition as being prepared by adding a quinone diazide compound to an alkali-soluble novolac resin, thereby rendering the composition hardly soluble in a basic aqueous solution to be used as a developer. This system is characterized by making the best use of the nature that the quinone diazide compound used is inherently insoluble in a basic aqueous solution and only soluble in an organic solvent, but when exposed to ultraviolet rays, the quinone diazide group contained is decomposed, thereby forming, passing through a ketene group, a carboxyl group and rendering the compound easily soluble in a basic aqueous solution Examples of such positive type photosensitizers are 1,2-quinone diazide compounds described in patents and other technical publications listed at pages 339 to 357, "Light-sensitive systems", J. Kosar (John Wiley & Sons Inc.). Such positive type photosensitive compositions are, in general, far excellent in resolving power than negative type compositions and this is the main reason why they have been advantageously used as etching-proof materials in the preparation of printed wiring boards and integrated circuit boards. However, in the abovementioned system, there are some problems such that since the novolac resins are prepared by a condensation polymerization process, the products are subject to wide fluctuations in properties and since the softening point is considerably high in despite of a comparatively lower molecular weight of the resin, they are, in general, brittle and also poor in adhesion to a supporting plate when used as a resist film. Therefore, it has long been desired to make up the abovesaid drawbacks. Another proposal has also been made in which a 1,2-quinone diazide compound is admixed with a copolymer of a conjugated diolefinic hydrocarbon, monoolefinically unsaturated compound and an α,β-ethylenically unsaturated carboxylic acid (Japanese Patent Application Kokai No. 122031/81). In this system, it is said that flexibility and adhesion to a supporting plate is considerably good. However, in order to make this system alkali-soluble by photo-irradiation, it is essential that the content of α,β-ethylenically unsaturated carboxylic acid in the resin be increased to a considerably higher level, which, in turn, will cause additional problems such that at the developing stage, the unexposed image area is liable to be swelled, thereby lowering the resolving power of the system. It is, therefore, a principal object of the present invention to provide a positive type photosensitive resinous composition which is excellent in flexibility and adhesion, and moreover, capable of resulting a coating whose unexposed area will give the least swelling at the development stage.

DISCLOSURE OF THE INVENTION

In accordance with the present invention, the abovesaid object can be attained with a positive type photosensitive resinous composition comprising a resin obtained by reacting (A) at least one polyepoxide compound having an epoxy equivalent of 75 to 1000 selected from the group consisting of polyvalent alcohol glycidyl ether compound, polycarboxylic acid glycidyl ester compound, alicyclic glycidyl compound, glycidyl amine compound, heterocyclic glycidyl compound and bisphenol-A alkylene oxide compound, with (B) an aromatic or heterocyclic carboxylic acid bearing a phenolic hydroxyl group(s) having the structure

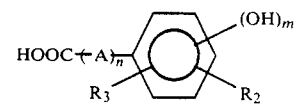

wherein A is substituted or unsubstituted alkylene or arylene,

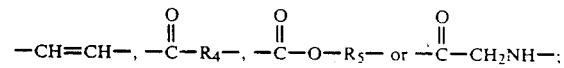

$R_4$ and $R_5$ are substituted or unsubstituted alkylene or arylene group; n stands for 0 or 1; m is an integer from 1 to 3; $R_2$ and $R_3$ are the same or different and each represents hydrogen, halogen, alkyl, alkenyl, nitrile or alkoxyl group and also can be an aromatic alicyclic or heterocyclic ring formed together with carbon atoms of the benzene ring of the abovesaid carboxylic acid (B); and (C) 1,2-quinonediazido sulfonic acid halide in the proportions by equivalent of carboxyl group of (B): epoxy group of (A)=1:0.8 to 1.2 and phenolic hydroxyl group of (B): sulfonyl halide group of (C)=1:0.05 to 1.2.

BEST MODE OF THE INVENTION

The positive type photosensitive resinous composition of the present invention can be quite advantageously prepared by either one of the following processes; that is, (A) at least one polyepoxide compound having an epoxy equivalent of 75 to 1000 selected from the group consisting of polyvalent alcohol glycidyl ether compound, polycarboxylic acid glycidyl ester compound, alicyclic glycidyl compound, glycidyl amine compound, heterocyclic glycidyl compound and bisphenol-A alkylene oxide compound is reacted with (B) an aromatic or heterocyclic carboxylic acid bearing a phenolic hydroxyl group(s) having the structure

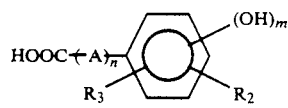

wherein A is substituted or unsubstituted alkylene or arylene,

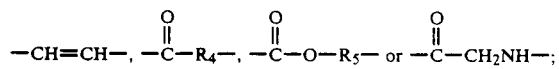

$R_4$ and $R_5$ are substituted or unsubstituted alkylene or arylene group; n stands for 0 or 1; m is an integer from 1 to 3; $R_2$ and $R_3$ are the same or different and each represents hydrogen, halogen, alkyl, alkenyl, nitrile or alkoxyl group and also can be an aromatic, alicyclic or heterocyclic ring formed together with carbon atoms of the benzene ring of the abovesaid carboxylic acid (B) in the proportion by equivalent of carboxyl group of (B): epoxy group of (A)=1:0.8 to 1.2 and thereafter, thus obtained product is reacted with (C) 1,2-quinonediazido sulfonic acid halide in the proportion by equivalent of phenolic hydroxyl group of (B): a sulfonyl halide group of (C)=1:0.05 to 1.2; or said aromatic or heterocyclic carboxylic acid with a phenolic hydroxyl group(s) having the formula (B) is reacted with (C) 1,2-quinonediazido sulfonic acid halide in the proportion by equivalent of a phenolic hydroxyl group of (B): a sulfonyl halide group of (C)=1:0.05 to 1.2 and thereafter, the thus obtained reaction product is reacted with said polyepoxide compound in the proportion by equivalent of carboxyl group of (B): an epoxy group of (A)=1:0.8 to 1.2. The former is, however, most preferable from the view point of evading possible decomposition of 1,2-quinonediazido sulfonyl compound by heat. As used herein the term "polyepoxide compound" shall mean polyepoxide compound containing 1.2 or more epoxy groups per molecule. The polyepoxide compounds (A) used in the invention is at least one compound selected from the group consisting of glycidyl ethers of polyvalent alcohols, glycidyl esters of polycarboxylic acids, alicyclic glycidyl compounds, glycidyl amine compounds, heterocyclic glycidyl compounds and alkylene oxides compounds of bisphenol-A, having an epoxy equivalent of 75 to 1000, preferably 100 to 350. If the epoxy equivalent is less than 75, the film-forming property of the composition is no good due to the lower molecular weight, whereas if the epoxy equivalent is more than 1000, the positive type photosensitivity would be coming down due to the higher molecular weight and the resulting composition would become hardly soluble in an alkaline aqueous solution. Therefore, the desired effects cannot be expected with the polyepoxide compound having an epoxy equivalent of less than 75 or more than 1000. More specifically, the following polyepoxide compounds may advantageously be used in the invention (a) glycidyl ethers of polyvalent alcohols:

as, for example, polyethyleneglycol diglycidyl ether, polypropyleneglycol diglycidyl ether, neopentylglycol diglycidyl ether, glycerine diglycidyl ether, trimethylolpropane triglycidyl ether, resorcin diglycidyl ether and the like, (b) glycidyl esters of polycarboxylic acids as, for example, phthalic acid diglycidyl ester, tetrahydrophthalic acid diglycidyl ester, adipic acid diglycidyl ester, dimer acid diglycidyl ester and the like, (c) alicyclic glycidyl compounds as, for example, hydrogenated bisphenol-A diglycidyl ether, cyclohexane derivatives, dicyclopentadiene and the like, (d) glycidyl amine compounds:

as, for example, tetraglycidyl bisaminomethyl cyclohexane and the like, (e) heterocyclic glycidyl compounds as, for example, triglycidyl isocyanurate, N,Ndiglycidyl 5,5-dimethyl hydantoin and the like, (f) alkylene oxide compounds of bisphenol-A as, for example, diglycidyl ether of propylene oxide 2 moles addition product of bisphenol-A and the like.
By the selective use of appropriate polyepoxide compounds as abovementioned, it is possible to obtain a coating with excellent flexibility and adhesion as well as improved resolving power.

The aromatic or heterocyclic carboxylic acids bearing phenolic hydroxyl groups used in the invention may be represented by the formula:

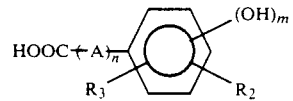

or unsubstituted alkylene or arylene,

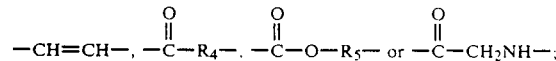

$R_4$ and $R_5$ are substituted or unsubstituted alkylene or arylene group; n stands for 0 or 1; m is an integer from 1 to 3; $R_2$ and $R_3$ are the same or different and each represents hydrogen, halogen, alkyl, alkenyl, nitrile or alkoxyl group and also can be an aromatic, alicyclic or a heterocyclic ring formed together with carbon atoms of the benzene ring included in the abovementioned formula. Specific examples of such carboxylic acids are 3-methoxy salicylic acid, 3-methyl salicylic acid, 5-tert-octyl salicylic acid, 3-chloro-4-hydroxy benzoic acid, 5-fluoro-3-hydroxy benzoic acid, 4-methyl thio-salicylic acid, 3-hydroxy-4-nitrobenzoic acid, 3,5-dimethyl-4-hydroxy benzoic acid, 3,5-di-tert-butyl-4-hydroxy benzoic acid, 3-phenyl salicylic acid, 4-benzamido-salicylic acid, 4-dimethylamino salicylic acid, 3,4-dihydroxy benzoic acid, 2,3-dihydroxy benzoic acid, 2,6-dihydroxy benzoic acid, 4-bromo-3,5-dihydroxy benzoic acid, 3,4,5-trihydroxy benzoic acid, 2,4,6-trihydroxy benzoic acid, dibromo gallic acid, o-hydroxyphenyl acetic acid, m-hydroxyphenyl acetic acid, p-hydroxyphenyl acetic acid, 4-hydroxy-3-methoxy phenyl acetic acid, dl-4-hydroxy-3-methoxy mandelic acid, p-hydroxyphenyl pyruvic acid, 3-(p-hydroxyphenyl)-lactic acid, dl-3,4-dihydroxy mandelic acid, 3,4-dihydroxyphenyl acetic acid, o-hydroxy cinnamic acid, m-hydroxy cinnamic acid, p-hydroxy cinnamic acid, 3- hydroxy-4-methoxy cinnamic acid, 3,4-dihydroxy cinnamic acid, 3,5-dimethoxy-4-hydroxy cinnamic acid, 3,4-dihydroxy hydrocinnamic acid, N-(p-hydroxyphenyl) glycine, 3,5-di-iodo-thiocyne, homogentisic acid and the like.

However, the carboxylic acids of the present invention are not limited to the abovementioned compounds, but any aromatic or heterocyclic carboxylic acids bearing phenolic hydroxyl groups, represented by the abovementioned formula may be advantageously used for the purpose of this invention. Said polyepoxide compound (A) and said carboxylic acid (B) are reacted in the proportion by equivalent of carboxyl group: epoxy group=1:0.8 to 1.2, preferably 1:0.9 to 1.1, usually in a solvent and in the presence of a catalyst at 50 to 180° C., preferably 80° to 150° C. As a solvent, such member as dioxane, methyl isobutyl ketone, tetrahydrofuran, methyl ethyl ketone or the like, is used in an appropriate amount as, for example, 50 to 500 parts per 100 parts resin, by weight. As the catalyst, any of the members heretofore known to be useful as a catalyst for the reaction between epoxy group and carboxyl group may be satisfactorily used. Examples are inorganic alkali as potassium hydroxide, sodium hydroxide and the like; quaternary ammonium salts as triethylbenzyl ammonium chloride, tetramethyl ammonium chloride and the like; tertiary amines as benzyl methyl amine, tributyl amine, tris(dimethylamino) methyl phenol and the like; and imidazole compounds as 2-methyl-4-ethyl imidazole, 2-methyl imidazole and the like. Such catalyst is used in a conventional catalitic amount as, for example, 0.01 to 5% by weight. However, as already stated, in the present invention, it is essential that the proportion by equivalent of carboxyl to epoxy groups be selected in a range of 1:0.8 to 1:1.2. If the proportion of epoxy is less than 0.8 per 1 equivalent carboxyl, excessively larger quantity of free carboxyl groups will remain in the final resin. Thus, an alkali soluble resin will be produced and developing properties will be adversely affected therewith. On the contrary, if the proportion of epoxy groups exceeds the upper limit of 1.2 per 1 equivalent carboxyl, a crosslinking reaction of the polyepoxy compounds will occur, causing an increase in the alkali resistance of the resin. Thus, the developing properties are likewise affected adversely. In this invention, 1,2-quinonediazido sulfonic acid halide as for example, 1,2-naphthoquinonediazido-4-sulfonyl chloride, 1,2-naphthoquinonediazido-5-sulfonyl chloride or 1,2-benzoquinonediazido-4-sulfonyl chloride and the like is then reacted with the abovementioned reaction product of the polyepoxide compound and the aromatic or heterocyclic carboxylic acid bearing phenolic hydroxyl groups, in the proportion by equivalent of phenolic hydroxyl group: sulfonyl halide group=1:0.05 to 1.2, preferably 1:0.1 to 1.0. This reaction is favorably effected usually in such a solvent as dioxane, acetone, tetrahydrofuran, methyl ethyl ketone and in the presence of a catalyst known to be useful in the reaction between a hydroxyl group and a sulfonyl halide, as, for example, inorganic alkali like sodium carbonate, sodium hydroxide and the like and organic amines like diethylamine, triethylamine and the like, at −20° to 50° C., preferably −10° to 30° C. The reaction conditions may be appropriately selected depending on the starting materials used and however, preference is given to the selection of lower temperature condition, seeing from the stability of the 1,2-naphthoquinonediazido compound used. It is pointed that the abovesaid proportion by equivalent of phenolic hydroxyl group to sulfonyl group is essential in this invention. This is because, if the proportion of sulfonyl halide is less than 0.05 equivalent per 1 equivalent phenolic hydroxyl, the quinondiazido content in the final resin will be too small to get the desired alkali solubility when photo-decomposed and therefore, the object of the invention cannot be attained. Whereas, if the proportion of sulfonyl halide is more than 1.2 equivalent per 1 equivalent phenolic hydroxyl, quinonediazido compounds having lower molecular weights remain in quantity as impurities in the final resin and the desired clear images may not be obtained. Furthermore, there is a considerable fluctuation in the film properties, which are not desired. The present resinous composition may also be prepared industrially advantageously by reacting an aromatic or heterocyclic carboxylic acid bearing phenolic hydroxyl groups (B) with 1,2-quinonediazido sulfonic acid halide (C) in a similar manner as previously mentioned and then reacting with polyepoxide compound (A). However: from the standpoint of heat stability of 1,2-quinondiazido compounds, much preference is given to the former method than the latter. The resinous composition of this invention has an excellent film-forming property and can result a coating with excellent flexibility and adhesion properties. When the coating is exposed to actinic light as, for example, ultraviolet rays, the, quinone diazide groups are decomposed and the resin acquire solubility towards alkali aqueous solutions. Therefore, the resinous composition of this invention is very useful as a positive type photosensitive resinous composition having excellent resolving power. If desired, the resinous composition of this invention may further contain other known alkali soluble resins and other known 1,2-quinonediazide compounds. Storage stabilizers, dyestuffs, pigments and other known additives may also be added thereto. In the preparation of a photosensitive layer, the resinous composition of this invention comprising the abovementioned constituents may be dissolved in an appropriate solvent and then applied on a supporting substrate by using a known coating method as by using a spinner or a coater, and finally subjected to drying. Examples of such solvents are glycol ethers such as ethyleneglycol monomethyl ether, ethyleneglycol monoethyl ether and the like; cellosolve acetates such as methyl Cellosolve acetate, ethyl Cellosolve acetate and the like; aromatic hydrocarbons such as toluene, xylene and the like; ketones such as methyl ethyl ketone, cyclohexanone and the like; and esters such as ethyl acetate, butyl acetate and the like. These solvents are used each singularly or in combination of 2 or more of them. Examples of supporting substrates are silicone wafers, aluminum plates, plastic films, paper, vitreous plates, copper plates, copper-clad laminates for use in printed wiring boards and the like. These supporting substrates are appropriately selected depending on the intended application. The present resinous composition may also be applied by an electrodeposition means. For this purpose, the present resinous composition is added with an acidic group bearing binder resin partially or completely neutralized with an organic amine and the combined composition is dissolved or dispersed in water. The thus obtained aqueous liquid is used as am anode in an electrodeposition bath of a positive type photosensitive resinous composition. The supporting substrate to be electrodeposited may be of any conventional type, including copper-clad laminates, aluminium plates and the like. The invention shall be now more fully explained in the following Examples. Unless otherwise being stated, all parts and percentages are by weight.

EXAMPLE 1

Into a 1000 milliliter three-necked separable flask, was placed 68 parts of ethylene glycol diglycidyl ether (epoxy equivalent 135), 86 parts of 3,4,5-trihydroxy benzoic acid and 100 parts of dioxane. The mixture was heated to 120° C., added with 0.3 parts of benzyl dimethylamine as a catalyser and thereafter reacted at 120° C. for 5 hours. The acid value of the reaction solution was 5.0 and the reaction rate was 97.3%. Then the mixture was allowed to cool to 10° C., added with 270 parts of 1,2-naphthoquinonediazido-5-sulfonyl chloride and 300 parts of dioxane. The mixture was reacted being added dropwise with 120 parts of triethylamine as a catalyser at 10° C. for 2 hours. Thereafter the reaction mixture was dropwise added to a large quantity of 2% diluted hydrochloric acid aqueous solution to obtain a resinous precipitate. After being washed with water, the precipitate was subjected to vacuum drying at 40° C. for 15 hours to obtain positive type photosensitive resin [A] whose yield was 95%. The thus obtained positive type photosensitive resin [A] was dissolved in ethylene glycol monomethyl ether to make up a solution having a solid content of 15%. The resulting solution was filtered through a membrane filter of 0.2 μm and applied over a silicon oxide film wafer by a spinner. The coated wafer was then dried in an oven at 80° C. for 15 minutes. The film thickness thereof was 1.0μm. For the evaluation of adhesion properties, the coated film of the abovesaid photosensitive resin on the wafer was cut with a cutter to form a scar thereupon and it was found that there was no such defects as cracks and peels. The coated wafer was illuminated through a resolution power test chart by a high pressure mercury lamp with a light intensity of 50 W/cm² (determined at 365 μm). Upon development with 2% aqueous solution of sodium carbonate at 30° C. for 60 seconds, the resulting resist was rinsed with deionized water to obtain a pattern whose resolving power was 0.6 μm.

EXAMPLE 2

Into a similar reaction vessel as used in Example 1, were placed 88 parts of phthalic diglycidyl ester (epoxy equivalent 175), 85 parts of 3,4-dihydroxy acetic acid and 58 parts of dioxane. The mixture was heated to 120° C., added with 1.5 parts of trimethyl ammonium choloride as a catalyser and thereafter reacted at 120° C. for 5 hours. The acid value of the reaction solution was 7.0 and the reaction rate was 95.7%. Then the mixture was allowed to cool to 10° C., added with 250 parts of 1,2-napthoquinonediazido-5-sulfonyl chloride and 400 parts of acetone. The mixture was reacted being added with dropwise 60 parts of triethyl amine as a catalyser at 10° C. for 2 hours. Thereafter the reaction mixture was dropwise added to a large quantity of 2% diluted hydrochloric acid aqueous solution to obtain a resinous precipitate. After being washed with water, the precipitate was subjected to vacuum drying at 40° C. for 20 hours to obtain a positive type photosensitive resin whose yield was 92%. Thus obtained positive type photosensitive resin was dissolved in ethylene glycol monomethyl ether to make up a solution having a solid content of 15%. The resulting solution was filtered through a membrane filter of 0.2 μm and applied over a silicon oxide film wafer by a spinner. The coated wafer was then dried in an oven 80° C. for 15 minutes. The film thickness thereof was 1.0μm. The evaluations of adhesion property and resolving power was conducted in the same manner as in Example 1. The results of those evaluations are illustrated in Table 1.

EXAMPLE 3

Into a similar reaction vessel as used in Example 1, was placed 110 parts of hydrogenated bisphenol-A diglycidyl ether (epoxy equivalent 220), 97 parts of 3-hydroxy-4-cinnamic acid and 69 parts of dioxane. The mixture was heated to 120° C., added with 1.5 parts of trimethyl ammonium chloride as a catalyser and thereafter reacted at 120° C. for 5 hours. The acid value of the reaction solution was 6.0 and the reaction rate was 95.6%. Then the mixture was allowed to cool to 10° C., and mixed with 135 parts of 1,2-naphthoquinonediazide-4-sulfonyl chloride and 500 parts of acetone. The mixture was reacted being added dropwise with 60 parts of triethyl amine as a catalyser at 10° C. for 2 hours. Thereafter the reaction mixture was added dropwise to a large quantity of 2% diluted hydrochloric acid aqueous solution to obtain a resinous precipitate. After being washed with water, the precipitate was subjected to vacuum drying at 40° C. for 20 hours to obtain a positive type photosensitive resin whose yield was 92%. Thus obtained positive type photosensitive resin was dissolved in ethylene glycol monomethyl ether make up a solution having a solid content of 15%. The resulting solution was filtered through a membrane filter of 0.2 μm and applied over a silicon oxide film wafer by a spinner. The coated wafer was then dried in an oven at 80° C. for 15 minutes. The film thickness thereof was 1.0 μm. The evaluations of adhesion property and resolving power was conducted in the same manner as in Example 1. The results of those evaluations are illustrated in Table 1.

EXAMPLE 4

Into a similar reaction vessel as used in Example 1, were placed 56 parts of tetraglycidyl bisaminomethyl cyclohexane (epoxy equivalent 110), 95 parts of 3,4-dihydroxy cinnamic acid and 50 parts of dioxane. The mixture was heated to 120° C., added with 1.5 parts of benzyl dimethylamine as a catalyser and thereafter reacted at 120° C. for 5 hours. The acid value of the reaction solution was 5.0 and the reaction rate was 97.5%. Then the mixture was allowed to cool to 10° C., added with 110 parts of 1,2-benzoquinonediazido-4-sulfonyl chloride and 600 parts of acetone. The mixture was reacted being added dropwise with 60 parts of triethyl amine as a catalyser at 10° C. for 2 hours. Thereafter the reaction mixture was dropwise added to a large quantity of 2% diluted hydrochloric acid aqueous solution to obtain a resinous precipitate. After being washed with water, the precipitate was subjected to vacuum drying at 40° C. for 17 hours to obtain a positive type photosensitive resin whose yield was 91%. Thus obtained positive type photosensitive resin was dissolved in ethylene glycol monomethyl ether to make up a solution having a solid content of 15%. The resulting solution was filtered through a membrane filter of 0.2 μm and applied over a silicon oxide film wafer by a spinner. The coated wafer was then dried in an oven at 80° C. for 15 minutes. The film thickness thereof was 1.0 μm. The evaluations of adhesion properties and resolving power was conducted in the same manner as in Example 1. The results of those evaluations are illustrated in Table 1.

EXAMPLE 5

Into a similar reaction vessel as used in Example 1, was placed 55 parts of triglycidyl isocyanurate (epoxy equivalent 105), 96 parts of 3-methoxy-4-hydroxy acetic acid and 50 parts of dioxane. The mixture was heated to 120° C., added with 1.5 parts of trimethyl ammonium chloride as a catalyser and thereafter reacted at 120° C. for 5 hours. The acid value of the reaction solution was 5.0 and the reaction rate was 97.4%. Then the mixture was allowed to cool to 10° C., added with 135 parts of 1,2-naphthaquinonediazido-4-sulfonyl chloride and 600 parts of dioxane. The mixture was reacted being added dropwise with 60 parts of triethyl amine as a catalyser at 10° C. for 2 hours. Thereafter the reaction mixture was dropwise added to a large quantity of 2% diluted hydrochloric acid aqueous solution to obtain a resinous precipitate. After being washed with water, the precipitate was subjected to vacuum drying at 40° C. for 24 hours to obtain a positive type photosensitive resin whose yield was 94%. Thus obtained positive type photosensitive resin was dissolved in ethylene glycol monomethyl ether to make up a solution having a solid content of 15%. The resulting solution was filtered through a membrane filter of 0.2 μm and applied over a silicon oxide film wafer by a spinner. The coated wafer was then dried in an oven at 80° C. for 15 minutes. The film thickness thereof was 1.0 μm. The evaluations of adhesion property and resolving power was conducted in the same manner as in Example 1. The results of those evaluations are illustrated in Table 1.

EXAMPLE 6

Into a similar reaction vessel as used in Example 1, were placed 67 parts of 2:1 mol adduct of bisphenol-A propylene oxide and diglycidyl ether (epoxy equivalent 315), 33 parts of 3,4-dihydroxy benzoic acid and 33 parts of dioxane. The mixture was heated to 120° C., added with 1.2 parts of trimethyl ammonium chloride as a catalyser and thereafter reacted at 120° C. for 5 hours. The acid value of the reaction solution was 5.0 and the reaction rate was 94.4%. Then the mixture was allowed to cool to 10° C., added with 114 parts of 1,2-naphthoquinonediazido-4-sulfonyl chloride and 550 parts of acetone. The mixture was reacted being added dropwise with 51 parts of triethyl amine as a catalyser at 10° C. for 2 hours. Thereafter the reaction mixture was added dropwise to a large quantity of 2% diluted hydrochloric acid aqueous solution to obtain a resinous precipitate. After being washed with water, the precipitate was subjected to vacuum drying at 40° C. for 20 hours to obtain a positive type photosensitive resin whose yield was 95%. Thus obtained positive type photosensitive resin was dissolved in ethylene glycol monomethyl ether to make up a solution having a solid content of 15%. The resulting solution was filtered through a membrane filter of 0.2 μm and applied over a silicon oxide film wafer by a spinner. The coated wafer was then dried in an oven at 80° C. for 15 minutes. The film thickness thereof was 1.0 μm. The evaluations of adhesion property and resolving power was conducted in the same manner as in Example 1. The results of those evaluations are illustrated in Table 1.

EXAMPLE 7

Into a similar reaction vessel as used in Example 1, were placed 67 parts of trimethylol propane triglycidyl ether (epoxy equivalent 150), 71 parts of 3-methyl salicylic acid and 46 parts of ethylene glycol monobutyl ether acetate. The mixture was heated to 120° C., added with 1.3 parts of trimethyl ammonium chloride as a catalyser and thereafter reacted at 120° C. for 5 hours. The acid value of the reaction solution was 5.5 and the reaction rate was 96.6%. Then the mixture was allowed to cool to 10° C., and mixed with 125 parts of 1,2-naphthoquinonediazide-5-sulfonyl chloride and 600 parts of acetone. The mixture was reacted by adding it dropwise with 60 parts of triethyl amine as a catalyser at 10° C. for 2 hours. Thereafter the reaction mixture was added dropwise to a large quantity of 2% diluted hydrochloric acid aqueous solution to obtain a resinous precipitate. After being washed with water, the precipitate was subjected to vacuum drying at 40° C. for 18 hours to obtain a positive type photosensitive resin whose yield was 95%. Thus obtained positive type photosensitive resin was dissolved in ethylene glycol monomethyl ether to make up a solution having a solid content of 15%. The resulting solution was filtered through a membrane filter of 0.2 μm and applied over a silicon oxide film wafer by a spinner. The coated wafer was then dried in an oven at 80° C. for 15 minutes. The film thickness thereof was 1.0 μm. The evaluations of adhesion property and resolving power was conducted in the same manner as in Example 1. The results of those evaluations are illustrated in Table 1.

TABLE 1

| Examples | 1 | 2 | 3 | 4 | 5 | 6 | 7 |
|---|---|---|---|---|---|---|---|
| Adhesion to the wafer*1 | | | | | | | |
| resolving power (μm) | 0.6 | 0.9 | 0.8 | 1.0 | 1.0 | 1.0 | 0.6 |

*1 The photosensitive coating film formed and dried was cut with a cutter to give a scar, and cracks and peels of the coating film therby given rise to were observed.
: excellent : good

Possibility of industrial application

As stated above, the positive type photosensitive resin composition of the present invention is useful for microfabrication photoresist and photosensitive materials for use in lithographic plates because of excellent flexibility with regard to coating films thereof and adhesion to a supporting substrate, and moreover, when developed, the non-exposed parts have an extremely reduced swelling capacity.

What is claimed is:

1. A positive type photosensitive resinous composition comprising a photosensitive resin obtained by reacting
   (A) at least one polyepoxide compound having an epoxy equivalent of 75 to 1000 selected from the group consisting of a polyvalent alcohol glycidyl ether compound, a polycarboxylic acid glycidyl ester compound, an alicyclic glycidyl compound, a glycidyl amine compound, a heterocyclic glycidyl compound and a bisphenol-A alkylene oxide compound, with
   (B) an aromatic or heterocyclic carboxylic acid bearing a phenolic hydroxyl group having the structure

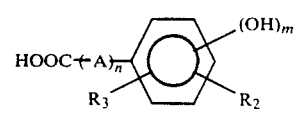

Wherein A is substituted or unsubstituted alkylene or arylene,

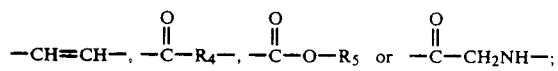

$R_4$ and $R_5$ are substituted or unsubstituted alkylene or arylene groups; n stands for 0 or 1; m is an integer from 1 to 3; $R_2$ and $R_3$ are the same or different, and each represents a hydrogen, halogen, alkyl, alkenyl, nitrile or alkoxyl group and also can be an aromatic, alicyclic or heterocyclic ring formed together with carbon atoms of the benzene ring of the abovesaid carboxylic acid (B); and (C) 1,2-quinonediazido sulfonic acid halide in the proportions by equivalent of the carboxyl groups of (B): an epoxy group of (A)=1:0.8 to 1.2 and a phenolic hydroxyl group of (B): sulfonyl halide group of (C)=1:0.05 to 1.2.

2. A positive type photosensitive resinous composition according to claim 1, wherein 1,2-quinonediazido sulfonic acid halide is 1,2-naphthoquinonediazido-4-sulfonyl chloride, 1,2-naphthoquinonediazido-5-sulfonyl chloride or 1,2-benzoquinonediazido-4-sulfonyl chloride.

* * * * *